(12) United States Patent
Tanaka et al.

(10) Patent No.: US 10,010,006 B2
(45) Date of Patent: Jun. 26, 2018

(54) ELECTRONIC CONTROL DEVICE AND METHOD OF MANUFACTURING ELECTRONIC CONTROL DEVICE

(71) Applicant: MITSUBISHI ELECTRIC CORPORATION, Chiyoda-ku, Tokyo (JP)

(72) Inventors: Takaaki Tanaka, Tokyo (JP); Hisakazu Yamane, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 252 days.

(21) Appl. No.: 13/972,321

(22) Filed: Aug. 21, 2013

(65) Prior Publication Data

US 2014/0285985 A1 Sep. 25, 2014

(30) Foreign Application Priority Data

Mar. 22, 2013 (JP) .................................. 2013-059948

(51) Int. Cl.
*H05K 5/06* (2006.01)
*H01R 12/58* (2011.01)
(Continued)

(52) U.S. Cl.
CPC ........... *H05K 5/069* (2013.01); *H05K 5/0069* (2013.01); *H01R 12/585* (2013.01);
(Continued)

(58) Field of Classification Search
CPC .... H05K 5/069; H05K 5/0069; H01R 12/716; H01R 12/724; H01R 12/58;
(Continued)

(56) References Cited

U.S. PATENT DOCUMENTS 1,374,963 A * 4/1921 Stevenson ............... F16G 11/12
403/308
3,204,586 A * 9/1965 Marsh, Jr. ................ F23M 5/06
110/331
(Continued)

FOREIGN PATENT DOCUMENTS

JP         54-31158 A    8/1977
JP         2-131709 U    1/1990
(Continued)

OTHER PUBLICATIONS

Japanese Office Action dated Dec. 10, 2013 issued in Japanese Patent Application 2013-059948.

*Primary Examiner* — Dimary Lopez Cruz
*Assistant Examiner* — Abhishek Rathod
(74) *Attorney, Agent, or Firm* — Sughrue Mion, PLLC; Richard C. Turner

(57) ABSTRACT

Provided is an electronic control device, in which positioning of a case including a connector housing portion and a pin header portion of a connector mounted on an electronic circuit board may be carried out easily with high accuracy so that ease of assembly and a water-proof property of the connector are improved. The electronic control device includes: an electronic circuit board (1) on which a pin header (30) used for electric connection to an external device is mounted together with an electronic component (11); and a case (2) for receiving the electronic circuit board therein, the case including a connector housing portion (31) provided as an opening portion (310) at a position corresponding to the pin header. A cover (20) of the case including the connector housing portion and the pin header mounted on the electronic circuit board have a first positioning structure using press-fit.

11 Claims, 4 Drawing Sheets

(51) Int. Cl.
*H05K 5/00* (2006.01)
*H01R 12/70* (2011.01)
*H01R 13/66* (2006.01)

(52) U.S. Cl.
CPC ...... *H01R 12/7064* (2013.01); *H01R 13/6658* (2013.01); *Y10T 29/4913* (2015.01)

(58) Field of Classification Search
CPC .............. H01R 12/585; H01R 12/7064; H01R 13/6658; Y10T 29/4913
See application file for complete search history.

(56) References Cited

U.S. PATENT DOCUMENTS

| | | | | |
|---|---|---|---|---|
| 4,812,133 | A * | 3/1989 | Fleak | H01R 13/6315 248/27.3 |
| 4,927,372 | A * | 5/1990 | Collier | H01R 12/714 439/247 |
| 6,000,952 | A * | 12/1999 | Gladd | H01R 9/2466 361/736 |
| 6,034,876 | A * | 3/2000 | Ohno et al. | 361/752 |
| 6,042,392 | A * | 3/2000 | Tsuji | 439/76.1 |
| 6,290,523 | B1 * | 9/2001 | Barnhart | H01R 13/6315 439/248 |
| 6,350,949 | B1 * | 2/2002 | Boyd | H05K 7/026 174/17.05 |
| 6,371,802 | B1 * | 4/2002 | Smalley, Jr. | H01R 12/7023 439/567 |
| 6,419,516 | B1 * | 7/2002 | Parcet | 439/364 |
| 6,652,292 | B2 * | 11/2003 | Pratt | H01R 13/6658 439/620.09 |
| 6,683,789 | B1 * | 1/2004 | Sheynis et al. | 361/752 |
| 7,419,386 | B2 * | 9/2008 | Washihira | 439/76.2 |
| 8,023,273 | B2 * | 9/2011 | Chlumsky et al. | 361/752 |
| 2003/0161110 | A1 * | 8/2003 | Spasevski | H05K 7/20854 361/715 |
| 2005/0122694 | A1 * | 6/2005 | Kane | H05K 5/0069 361/752 |
| 2005/0152084 | A1 * | 7/2005 | Blasko | H01R 13/521 361/100 |
| 2005/0208797 | A1 * | 9/2005 | Duncan | H01R 4/028 439/83 |
| 2007/0161287 | A1 * | 7/2007 | Yamauchi | 439/567 |
| 2007/0238323 | A1 * | 10/2007 | Mathews | H01R 13/6275 439/65 |
| 2007/0295450 | A1 * | 12/2007 | Brandenburg | H01R 4/2404 156/293 |
| 2009/0023332 | A1 * | 1/2009 | Ringler | H01R 12/585 439/513 |
| 2009/0035964 | A1 * | 2/2009 | Yamamoto | H01R 12/58 439/79 |
| 2009/0258543 | A1 * | 10/2009 | Keyser | H05K 5/0069 439/660 |
| 2010/0041269 | A1 * | 2/2010 | Pham | H01H 50/048 439/555 |
| 2010/0086378 | A1 * | 4/2010 | Lin | F16B 37/00 411/436 |

FOREIGN PATENT DOCUMENTS

| | | |
|---|---|---|
| JP | 02-066865 A | 3/1990 |
| JP | 02-256183 A1 | 10/1990 |
| JP | 2001-283958 A1 | 10/2001 |

* cited by examiner

ELECTRONIC CONTROL DEVICE AND METHOD OF MANUFACTURING ELECTRONIC CONTROL DEVICE

BACKGROUND OF THE INVENTION

1. Field of the Invention

The present invention relates to an electronic control device including a connector for connecting an electronic circuit board housed inside a case to an external device, and a method of manufacturing the electronic control device.

2. Description of the Related Art

An electronic control device to be used for control of a vehicle or the like generally has the following structure. Specifically, the electronic control device includes an electronic circuit board and a connector. On the electronic circuit board, electronic components such as an input/output circuit, a communication circuit, a microcomputer, and a power-supply circuit are mounted. The electronic circuit board is housed inside a case. The connector is provided to connect the electronic circuit board to an external device.

As a structure of the case of the electronic control device described above, the following structure is known. Specifically, the case includes a cover and a base. The electronic circuit board is interposed between the cover and the base of the case. A surface of the cover and a surface of the base, which are held into contact with each other, are bonded with a water-proof sealing material or the like.

Moreover, the following technology for the connector of the electronic control device is known. The connector is formed as an independent structure. The connector includes a pin header portion including connection terminals to the external device and a connector housing portion including an opening portion for connecting the connection terminals to the external device.

As a structure of the connector obtained by applying the technology for the connector to the above-mentioned structure of the case, the following structure is known. Specifically, after the pin header portion is assembled to the electronic circuit board in advance, a printed circuit board is interposed between the cover and the base so that the pin header portion is assembled to the corresponding connector housing portion. In the above-mentioned manner, the connector is formed (see Japanese Patent Application Laid-open No. Hei 02-066865).

As a water-proof structure for the connector to be used in the electronic control device described above, the following structure is frequently used. Specifically, a water-proof packing provided on an outer circumference of a housing of a connector provided to the external device, such as a harness, is brought into close contact with an inner wall of a housing of the connector provided to the electronic control device. In this manner, a water-proof property is demonstrated.

However, the related art has the following problems.

In the electronic control device described in Japanese Patent Application Laid-open No. Hei 02-066865, the pin header portion and the connector housing portion which constitute the connector are formed as independent structures. Therefore, in order to demonstrate performance as the connector, the cover including the connector housing portion and the pin header portion are required to be positioned with high accuracy.

Therefore, when the positioning accuracy is not sufficiently high, there is a problem in that assembly of the device and fitting to the connector provided to the external device may fail.

Moreover, when the electronic control device is required to have the water-proof property, the connector is required to be positioned with higher accuracy. Therefore, even if the fitting itself is possible, there is a problem in that the water-proof property may become unsatisfactory because of insufficient contact with the water-proof packing provided to the connector on the external device side.

SUMMARY OF THE INVENTION

The present invention has been made to solve the problems described above, and therefore has an object to provide an electronic control device and a method of manufacturing the electronic control device, in which the positioning of a case including a connector housing portion and a pin header portion of a connector for connecting an electronic circuit board to an external device may be carried out easily with high accuracy at the time of formation of the connector so that ease of assembly and a water-proof property of the connector are improved.

According to an exemplary embodiment of the present invention, there is provided an electronic control device, including: an electronic circuit board on which a pin header used for electric connection to an external device is mounted together with an electronic component; and a case for housing the electronic circuit board therein, the case including a connector housing portion provided as an opening portion at a position corresponding to the pin header, in which: the case includes at least two case members; the at least two case members include a first case member including the connector housing portion; and the first case member including the connector housing portion and the pin header mounted on the electronic circuit board have a first positioning structure using press-fit.

Further, according to an exemplary embodiment of the present invention, there is provided a method of manufacturing an electronic control device, the electronic control device including: an electronic circuit board on which a pin header used for electric connection to an external device is mounted together with an electronic component; and a case for housing the electronic circuit board therein, the case including a connector housing portion provided as an opening portion at a position corresponding to the pin header, the case including at least two case members, the at least two case members including a first case member including the connector housing portion, the first case member including the connector housing portion and the pin header mounted on the electronic circuit board having a first positioning structure using press-fit, the method including: manufacturing a crush rib on the first case member; mounting, on the electronic circuit board, the pin header including a through hole into which the crush rib is to be press-fit; press-fitting the crush rib provided to the first case member into the through hole formed through the pin header so that the pin header and the connector housing portion are positioned by the first positioning structure; and fitting the first case member and one of the at least two case members other than the first case member to each other to house the electronic circuit board inside the case.

According to the present invention, it is possible to provide the electronic control device and the method of manufacturing the electronic control device, in which the positioning of the connector housing portion and the pin header portion of the connector for connecting the electronic circuit board to the external device may be carried out easily with high accuracy at the time of formation of the connector by providing the positioning structure using press-fit between the case including the connector housing portion and the pin header portion of the connector mounted on the electronic circuit board so that the ease of assembly and the water-proof property of the connector are improved.

DETAILED DESCRIPTION OF THE PREFERRED EMBODIMENT

Figure 1:
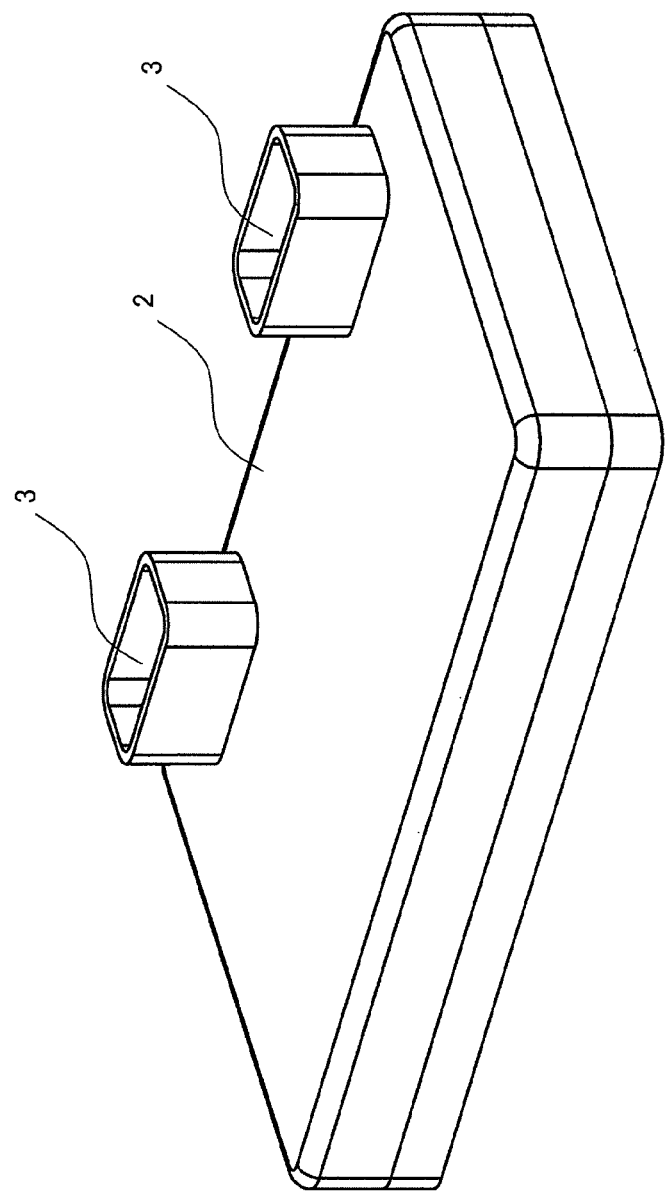
FIG. 1 is a perspective view illustrating an electronic control device according to a first embodiment of the present invention.

In the following, an electronic control device and a method of manufacturing the electronic control device according to an exemplary embodiment of the present invention are described referring to the accompanying drawings. In the drawings, the same or corresponding parts are denoted by the same reference symbols for description.

First Embodiment

FIG. 1 is a perspective view illustrating an electronic control device according to a first embodiment of the present invention. The electronic control device according to the first embodiment includes an electronic circuit board 1 (see FIGS. 2A and 2B), a case 2, and connectors 3.

The electronic control device according to the first embodiment has the following configuration. Specifically, the electronic circuit board 1 is housed inside the case 2. The electronic control device also includes the connectors 3 for connecting the electronic circuit board 1 to an external device (not shown). The electronic control device is mounted to, for example, an engine provided in an engine room.

Figure 2:
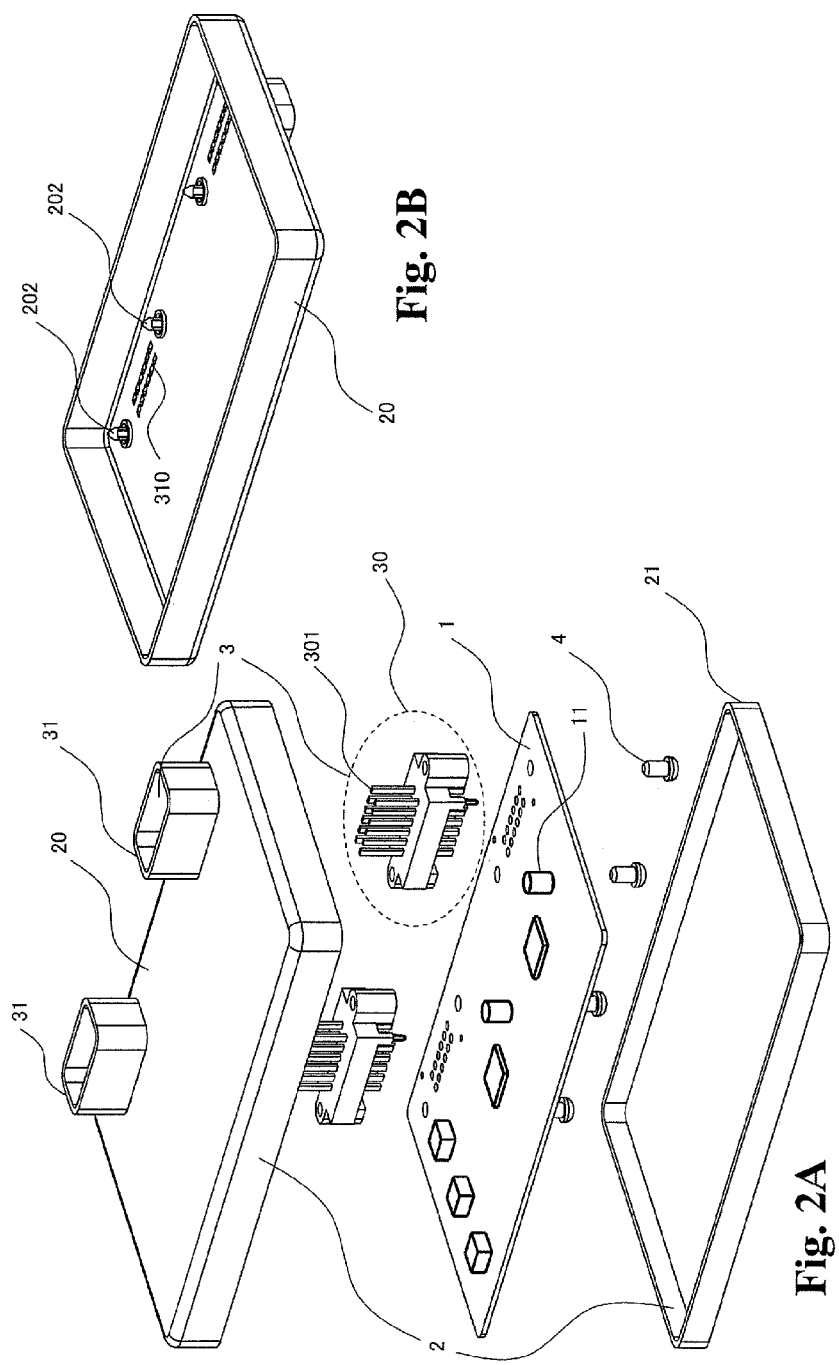
FIGS. 2A and 2B are exploded perspective views illustrating an example of an internal structure of the electronic control device according to the first embodiment of the present invention.

Next, FIGS. 2A and 2B are exploded perspective views illustrating an example of an internal structure of the electronic control device according to the first embodiment of the present invention. FIG. 2A illustrates the internal structure of the electronic control device as viewed from above at an oblique angle, and FIG. 2B is a diagram supplementary to FIG. 2A, for illustrating a structure of a cover 20 as viewed from a back surface thereof.

Figure 3:
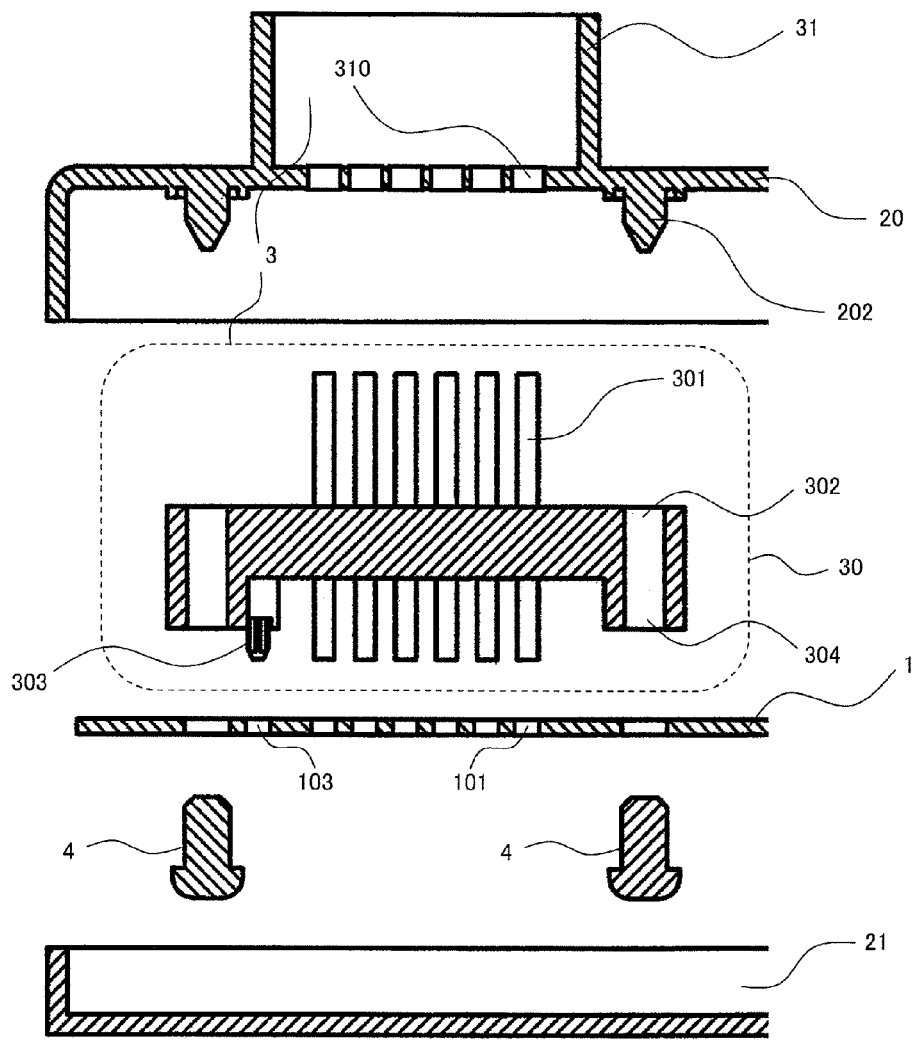
FIG. 3 is a partial sectional view illustrating a pin header and a connector housing portion which constitute a connector of the electronic control device according to the first embodiment of the present invention in an enlarged manner.

FIG. 3 is a partial sectional view illustrating a pin header 30 and a connector housing portion 31 constituting each of the connectors 3 of the electronic control device according to the first embodiment of the present invention in an enlarged manner.

The electronic circuit board 1 includes through holes 101 and a second boss hole 103. The case 2 includes the cover 20 and a base 21. The cover 20 includes the connector housing portions 31 and first crush ribs 202.

Each of the connectors 3 according to the first embodiment includes the pin header 30 to be mounted on the electronic circuit board 1 and the connector housing portion 31 provided to the cover 20.

Further, the pin header 30 includes connection terminals 301, first boss holes 302, a second crush rib 303, and screw holes 304. Each of the first boss holes 302 corresponds to one end of a through hole, whereas each of the screw holes 304 corresponds to another end of the through hole. The connector housing 31 includes openings 310 through which the connection terminals 301 pass, respectively.

First, referring to FIGS. 2A, 2B, and 3, functions of components of the electronic control device according to the first embodiment are described.

The electronic circuit board 1 includes electronic components 11 such as an input/output circuit, a communication circuit, a microcomputer, and a power-supply circuit provided on a printed circuit board.

The case 2 includes at least two case members. FIGS. 2A, 2B, and 3 illustrate an example where the case 2 includes two members, that is, the cover 20 and the base 21. However, the configuration of the case 2 is not limited thereto. The same effects are obtained even when the case 2 includes at least three case members.

When the case 2 includes at least three case members as described above, a case member including the connector housing 31 is referred to as "first case member". In FIGS. 2A, 2B, and 3, the cover 20 corresponds to the first case member.

The cover 20 is formed of, for example, a PBT resin, whereas the base 21 is formed of, for example, aluminum, stainless steel, or the PBT resin. However, the materials of the cover 20 and the base 21 are not limited to the above-mentioned materials.

As described above, each of the connectors 3 includes the pin header 30 and the connector housing portion 31. The pin header 30 includes the connection terminals 301 to be connected to the external device. The connector housing portion 31 includes the opening portions 310 for connecting the connection terminals 301 to the external device.

Ends on one side of the connection terminals 301 are inserted into the through holes 101 of the electronic circuit board 1 so as to be electrically connected to a circuit (not shown) such as an input/output portion of the electronic circuit board 1 and firmly fixed thereto. On the other hand, ends on another side of the connection terminals 301 project from the opening portions 310 of the cover 20 so as to be electrically connected to connectors provided on the external device side.

In the following, a procedure of assembly of the electronic control device according to the first embodiment of the present invention is described referring to FIGS. 2A, 2B, and 3.

First, each of the pin headers 30 is manufactured by outsert-molding of the connection terminals 301 into a seat made of a resin. Alternatively, each of the pin headers 30 can be manufactured by forming a similar shape by insert-molding or the like (see Japanese Patent Application Laid-open No. Hei 02-066865, for example).

Next, the pin headers 30 are fixed onto the electronic circuit board 1. Specifically, the connection terminals 301 are respectively inserted into the through holes 101 of the electronic circuit board 1. At this time, the second crush rib 303 is fitted into the second boss hole 103 of the electronic circuit board 1.

Further, the electronic circuit board 1 and the pin headers 30 are fixed with screws 4. The fixation with the screws 4 has the effects when a vibration resistance is particularly required as in the case where the electronic control device is mounted in an engine room. When the vibration resistance is not particularly required as in the case where the electronic control device is mounted in a vehicle cabin, the fixing screws 4 are not required to be used.

As described above, with a second positioning structure using the second crush rib 303 and the second boss hole 103, the positioning of the pin headers 30 on the electronic circuit board 1 can be realized easily with high accuracy.

Next, the cover 20 is mounted to the pin headers 30 fixed onto the electronic circuit board 1. Specifically, the connection terminals 301 are inserted into the openings 310 of the cover 20. At this time, the first crush ribs 202 provided in advance to the cover 20 are fitted into the first boss holes 302 provided to each of the pin headers 30.

As a result, a relative position of each of the pin headers 30 with respect to the cover 20 is determined by the first crush ribs 202 and the first boss holes 302.

At the time of positioning, portions of the connection terminals 301, which are located on the upper side (side facing the cover 20) of each of the pin headers 30, project from the openings 310 of corresponding one of the connector housing portions 31. The connectors 3 are formed of the pin headers 30 and the connector housing portions 31.

In consideration of ease of insertion of the connection terminals 301, each of the opening portions 310 is desired to be formed as a sufficiently large hole with respect to a diameter of each of the connection terminals 301. FIGS. 2A, 2B, and 3 illustrate an example where the opening portions 310 are provided corresponding to the respective connection terminals 301. However, the shape of the opening portions 310 is not limited thereto. For example, an entire internal space of each of the connector housing portions 31 may be formed as a single hole serving as the opening portion 310 as needed.

As described above, with a first positioning structure using the first crush ribs 202 and the first boss holes 302, the positioning of the pin headers 30 and the connector housings 31, which constitute the connectors 3, can be realized easily with high accuracy.

As a final step, the base 21 is mounted to the cover 20 to which the electronic circuit board 1 is already mounted. As a result, the electronic control device including the connectors 3, in which the electronic circuit board 1 is vertically interposed between the cover 20 and the base 21 so as to be housed therein, is completed.

When the electronic control device is required to have a water-proof property, a surface of the cover 20 and a surface of the base 21, which are held in contact with each other, are preferred to be sealed with a sealing material, a packing, or the like.

FIGS. 2A, 2B, and 3 illustrate an example where the first crush ribs 202 are provided to the cover 20 and the first boss holes 302 are provided to each of the pin headers 30. However, even when the first crush ribs 202 are provided to each of the pin headers 30 and the first boss holes 302 are provided to the cover 20, the same effects are obtained.

Similarly, FIGS. 2A, 2B and 3 illustrate an example where the second crush rib 303 is provided to each of the pin headers 30 and the second boss hole 103 is provided to the electronic circuit board 1. However, even when the second boss hole 103 is provided to each of the pin headers 30 and the second crush rib 303 is provided to the electronic circuit board 1, the same effects are obtained.

Figure 4:
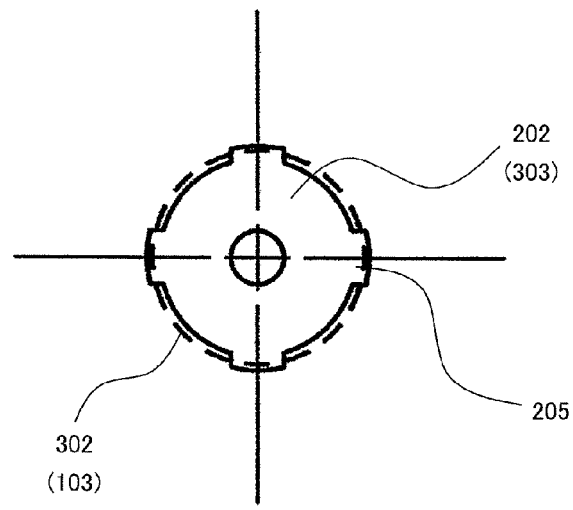
FIG. 4 is a partially enlarged view illustrating a fitting structure with a crush rib and a boss hole of the electronic control device according to the first embodiment of the present invention.

Next, FIG. 4 is a partially enlarged view illustrating a fitting structure using the crush rib and the boss hole of the electronic control device according to the first embodiment of the present invention.

In the following, the fitting structure using the crush rib and the boss hole is described referring to FIG. 4. The fitting structure is the same for the case where the first crush rib 202 and the first boss hole 302 are used and for the case where the second crush rib 303 and the second boss hole 103 whose reference symbols are parenthesized in FIG. 4 are used. Therefore, the former case is representatively described herein.

The first crush rib 202 includes rib portions 205. For example, as illustrated in FIG. 4, the first crush rib 202 at each of the rib portions 205 has a slightly larger outer diameter than a diameter of the first boss hole 302 indicated by a dotted line. When the first crush rib 202 is to be fitted into the first boss hole 302, the first crush rib 202 is inserted while the rib portions 205 are being crushed. In this manner, a center axis of the first crush rib 202 and a center axis of the first boss hole 302 can be aligned with each other for accurate positioning.

As described above, in the connector 3 positioned by using the first crush ribs 202, the pin header 30 and the connector housing portion 31 are directly positioned. As a result, a cumulative tolerance of the positioning is minimized to an error due to dimensional variations of the two components. Therefore, the connectors 3 can be formed with high accuracy.

Moreover, as illustrated in FIG. 3, each of the first boss holes 302 is formed as a through hole so as to be used also as the screw hole 304 for the fixing screw 4. As a result, an increase in area of the electronic circuit board 1 can be minimized. Thus, the electronic circuit board can be efficiently designed.

Figure 5:
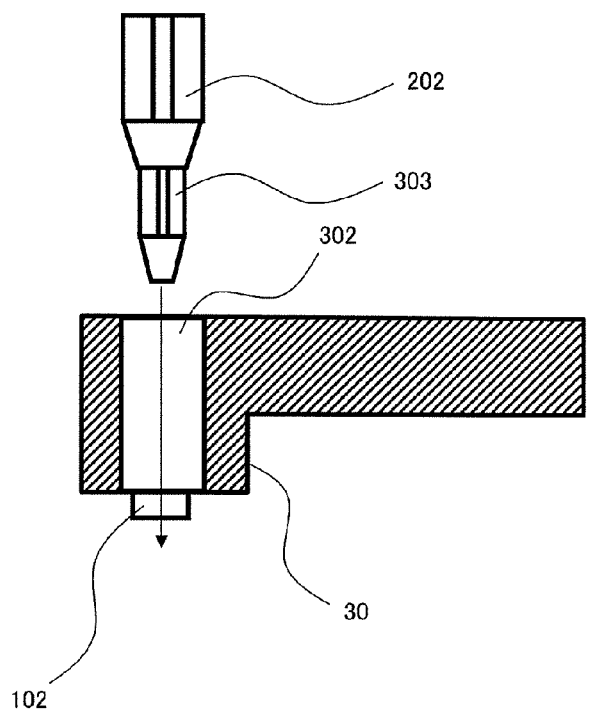
FIG. 5 is a diagram illustrating an example of a positioning structure for the pin header when a first crush rib and a second crush rib according to the first embodiment of the present invention are formed as an integral structure.

Next, FIG. 5 is a diagram illustrating an example of a positioning structure for each of the pin headers 30 when the first crush rib 202 and the second crush rib 303 according to the first embodiment of the present invention are formed as an integral structure.

In FIG. 5, the first crush rib 202, which is used to position the cover 20 and the pin header 30, and the second crush rib 303, which is used to position the electronic circuit board 1 and the pin header 30, are integrated into one structure and arranged on a straight line.

As a result, the cover 20, the pin headers 30, and the electronic circuit board 1 can be positioned with a minimum area. Moreover, the second crush rib 303, which is provided to each of the pin headers 30, can be eliminated to simplify the structure of the pin header 30.

FIG. 5 illustrates an example where the first crush rib 202 and the second crush rib 303 integrated into one structure are provided to the cover 20. However, even when the first crush rib 202 and the second crush rib 303 integrated into one structure are provided to the electronic circuit board 1, the same effects are obtained.

Next, a positioning method using the first crush rib 202 and the first boss hole 302 in the case where the electronic control device includes a plurality of the connectors 3 is described.

When the electronic control device includes the plurality of connectors 3 as illustrated in FIG. 2A, the number of the first positioning structures is limited to two for each electronic control device. For the remaining first boss hole(s)

302, it is desired to provide a clearance in a positioning portion so as to avoid perfect positioning.

The reason for the above-mentioned configuration is as follows. If the number of the first positioning structures, each including the first crush rib 202 and the first boss hole 302, provided to the electronic control device is at least three, the positioning structures interfere with each other because of a dimensional variation of each of the components. Consequently, accurate positioning cannot be performed for all the connectors 3. In order to avoid the disadvantage described above, the above-mentioned configuration is used.

For example, when the single case 2 includes the two connectors 3, two first positioning structures are provided to one of the connectors 3. For another of the connectors 3, for example, the first crush rib 202 without the rib portions 205 is used so that a clearance is provided with respect to a hole diameter of the first boss hole 302.

Alternatively, one first positioning structure may be provided to each of the connectors 3.

In the connector 3 without the first positioning structure, an error due to the dimensional variation is sequentially accumulated from the cover 20 through the positioned pin header 30 and the electronic circuit board 1 to the pin header 30 which is not positioned.

By designing a dimensional tolerance based on the cumulative tolerance of at least four components described above, however, the housing portions and the pin headers 30 can be positioned within a desired range of variation in terms of design. As a result, accurate positioning can be carried out.

When two first positioning structures are provided to one of the connectors 3 in a concentrated manner, the positioning accuracy of the connector 3 provided with the first positioning structures becomes higher than that of another of the connectors 3 without the first positioning structure.

Therefore, in the case where required conditions for the connectors 3 are different from each other, for example, when one of the connectors 3 is required to have the water-proof property whereas another is not, the first positioning structures only need to be provided in a concentrated manner to one of the connectors 3, which has a stricter requirement.

As described above, in the first embodiment, when the connectors for connecting the electronic circuit board to the external device are formed, the positioning structures using press-fit are provided between the case including the connector housing portions and the pin header portions of the connectors.

As a result, it is possible to obtain the electronic control device and the method of manufacturing the electronic control device, in which the positioning of the connector housing portions and the pin header portions may be carried out easily with high accuracy so that the ease of assembly and the water-proof property of the connector are improved.

What is claimed is:

1. An electronic control device, comprising:
an electronic circuit board on which a pin header used for electric connection to an external device is mounted together with an electronic component, the pin header comprises a plurality of connection terminals each inserted into each of a plurality of through holes formed in the electronic circuit board; and
a case for receiving the electronic circuit board therein, the case comprising a connector housing portion provided as an opening portion at a position corresponding to the pin header, wherein:
the case comprises at least two case members;
the at least two case members comprise a first case member including the connector housing portion and a plurality of through holes;
the first case member and the pin header are fastened together by a first press-fit connection structure;
the pin header and the electronic circuit board are fastened directly together by a second press-fit connection structure, mating components of the second press-fit connection structure being provided in the pin header and the electronic circuit board at positions spaced apart from the plurality of connection terminals and the plurality of through holes of the electronic circuit board respectively;
each of the plurality of connection terminals of the pin header is configured to be inserted into each of the plurality of through holes of the first case member;
the pin header comprises: at least one first boss hole, which is a through hole having a first end facing the first case member and having a second end, opposite from the first end facing a second case member and at least one rib, which is one of the components of the second press-fit connection structure such that the rib is positioned in a vicinity of the through hole.

2. An electronic control device according to claim 1, wherein:
the first press-fit connection structure comprises the first boss hole and a crush rib which fit each other;
the first boss hole is provided on the pin header, and the crush rib is provided on the first case member;
the electronic circuit board comprises a second boss hole and a third boss holes, which are though holes;
the crush rib of the first press-fit connection structure positioned in the first case member is inserted into the first end of the first boss hole;
a screw member is first inserted into the second boss hole of the electronic circuit board from a side of the second case member and then into the second end of the first boss hole of the pin header; and
the at least one rib of the second press-fit connection structure is inserted into the third boss hole of the electronic circuit board from a side facing the first case member.

3. An electronic control device according to claim 2, wherein:
the first end of the first boss hole fits onto the crush rib provided to the first case member so as to position the first case member and the pin header, and the second end of the through hole is used as a screw hole for fixing the pin header onto the electronic circuit board, and
each of the pin header comprises two first boss holes and a single rib of the second press-fit connection structure, the single rib being positioned next to one of the two first boss holes.

4. An electronic control device according to claim 1, further comprising a third press-fit connection structure formed as a structure obtained by integrating the first press-fit connection structure provided between the first case member and the pin header and the second press-fit connection structure provided between the electronic circuit board and the pin header.

5. An electronic control device according to claim 1, wherein the first case member comprises a plurality of the connector housing portions and the first press-fit connection structures provided at two positions.

6. An electronic control device according to claim 1, further comprising a pair of crush ribs which are disposed at opposite sides of the connector housing portion and configured to be fitted into boss holes disposed on the pin header.

7. An electronic control device according to claim 6, wherein the pair of crush ribs have an outer diameter greater than a diameter of the boss holes.

8. An electronic control device according to claim 1, wherein the pin header is detachably connected to the electronic circuit board.

9. An electronic control device according to claim 1, wherein the rib of the second press-fit connection structure is other than the plurality of connection terminals of the pin header, and is not inserted into the through hole in the pin header.

10. The electronic control device according to claim 1, wherein the rib of the second press-fit connection structure extends beyond the first boss hole and the connection terminals in a direction toward the electronic circuit board and the second case member.

11. A method of manufacturing an electronic control device, the electronic control device comprising:
an electronic circuit board having a plurality of through holes;
a pin header used for electric connection to an external device is mounted together with an electronic component, the pin header comprises a plurality of connection terminals and a through hole formed through the pin header, each of the plurality of connection terminals of the pin header being inserted into each of the plurality of through holes of the electronic circuit board; and
a case for receiving the electronic circuit board therein, the case comprising a connector housing portion provided as an opening portion at a position corresponding to the pin header, wherein:
the case comprising at least two case members,
the at least two case members comprising a first case member including the connector housing portion and a plurality of through holes,
the first case member and the pin header having a first press-fit connection structure, the pin header and the electronic circuit board having a second press-fit connection structure,
each of the plurality of connection terminals of the pin header is configured to be inserted into each of the plurality of through holes of the first case member, the method comprising:
manufacturing a first crush rib on the first case member and a second crush rib on the pin header at a position spaced apart from the plurality of connection terminals of the pin header;
mounting the pin header on the electronic circuit board, the electronic circuit board comprising a through hole formed therethrough at a position spaced apart from the plurality of through holes formed in the electronic circuit board and into which the second crush rib is to be press-fit;
fastening the first case member to the pin header by press-fitting the first crush rib provided to the first case member into the through hole formed through the pin header so that the pin header and the connector housing portion are positioned by the first press-fit connection structure;
directly fastening the pin header to the electronic circuit board by press-fitting the second crush rib provided to the pin header into the through hole formed through the electronic circuit board so that the pin header and the electronic circuit board are positioned by the second press-fit connection structure; and
fitting the first case member and one of the at least two case members other than the first case member to each other to house the electronic circuit board inside the case,
wherein the pin header comprises: at least one first boss hole, which is a through hole having a first end facing the first case member and having a second end, opposite from the first end, facing a second case member and at least one rib, which is one of the components of the second press-fit connection structure such that the rib is positioned in a vicinity of the through hole.

* * * * *